United States Patent [19]

Ishihara et al.

[11] Patent Number: 5,134,405
[45] Date of Patent: Jul. 28, 1992

[54] ELECTROMAGNETICALLY ANECHOIC CHAMBER AND SHIELD STRUCTURES THEREFOR

[75] Inventors: Katsuo Ishihara, Katano; Yoshio Tomiyama, Kawanishi, both of Japan

[73] Assignee: Matushita Electric Industrial Co., Ltd., Kadoma, Japan

[21] Appl. No.: 315,926

[22] Filed: Feb. 27, 1989

[30] Foreign Application Priority Data

Jul. 8, 1988 [JP] Japan .................. 63-171224

[51] Int. Cl.$^5$ .............................................. H01Q 17/00
[52] U.S. Cl. ............................................ 342/1; 342/4
[58] Field of Search ................................. 342/4, 1

[56] References Cited

U.S. PATENT DOCUMENTS

| | | | |
|---|---|---|---|
| 2,594,971 | 4/1952 | Moullin | 342/1 |
| 3,295,133 | 12/1966 | Emerson et al. | 342/4 |
| 3,365,667 | 1/1968 | Deutsch et al. | 342/1 X |
| 3,596,270 | 7/1971 | Fukui | 342/1 |
| 3,806,928 | 4/1974 | Costanza | 342/4 |
| 3,806,943 | 4/1974 | Holloway | 342/4 X |
| 3,887,920 | 6/1975 | Wright et al. | 342/1 |
| 4,118,704 | 10/1978 | Ishino et al. | 342/4 |
| 4,162,496 | 7/1979 | Downer et al. | 342/4 |
| 4,164,718 | 8/1979 | Iwasaki | 342/4 X |
| 4,218,683 | 8/1980 | Hemming | 343/703 |
| 4,387,786 | 6/1983 | Klipsch et al. | 181/150 |
| 4,467,327 | 8/1984 | Drake et al. | 434/2 |
| 4,473,826 | 9/1984 | Pusch et al. | 342/5 |
| 4,496,950 | 1/1985 | Hemming et al. | 342/4 |
| 4,901,080 | 2/1990 | McHenry | 342/1 |
| 4,906,998 | 3/1990 | Shibuya | 342/4 |
| 4,931,798 | 6/1990 | Kogo | 342/4 |
| 4,949,093 | 8/1990 | Dhanjal | 343/755 |
| 4,972,191 | 11/1990 | Ishino et al. | 342/1 |
| 4,973,963 | 11/1990 | Kurosawa et al. | 342/4 |

OTHER PUBLICATIONS

Atsuya Maeda; General remarks in Circumstance/-measuring arrangement of EMC in present state and problems; "Countermeasure for EMC in Present State"; pp. 56-63, edited and published by Kabushiki Kaisha Taiseisha on Jan. 25, 1988.

Yoshiro Sato; Open-site in Circumstance/measuring arrangement of EMC in present state and problems; "Countermeasure for EMC in Present State"; pp. 64-67, edited and published by Kabushiki Kaisha Taiseicha on Jan. 25, 1988.

Ken Ishino & Taro Miura; Anechoic chamber in Circumstance/measuring arrangement of EMC in present state and problems; "Countermeasure for EMC in Present State".

*Primary Examiner*—John B. Sotomayor
*Attorney, Agent, or Firm*—Cushman, Darby & Cushman

[57] ABSTRACT

The present invention relates to an electromagnetically anechoic chamber for EMC (Electromagnetic Compatibility) tests of electronic devices. The floor, ceiling and side wall of the anechoic chamber have panels of electromagnetic wave absorber having many ferrite tiles, and shield members comprising double layered shield members of copper sheets and iron sheets for absorbing and reflecting the foreign electromagnetic wave.

4 Claims, 7 Drawing Sheets

ELECTROMAGNETICALLY ANECHOIC CHAMBER AND SHIELD STRUCTURES THEREFOR

FIELD OF THE INVENTION AND RELATED ART STATEMENT

1. Field of the Invention

The present invention relates to an electromagnetically anechoic chamber for EMC (Electromagnetic Compatibility) testing of electronic devices. The EMC tests are noise assessment of radiating electromagnetic waves and test irradiation in a strong electric field.

2. Description of the Related Art

Figure 5:
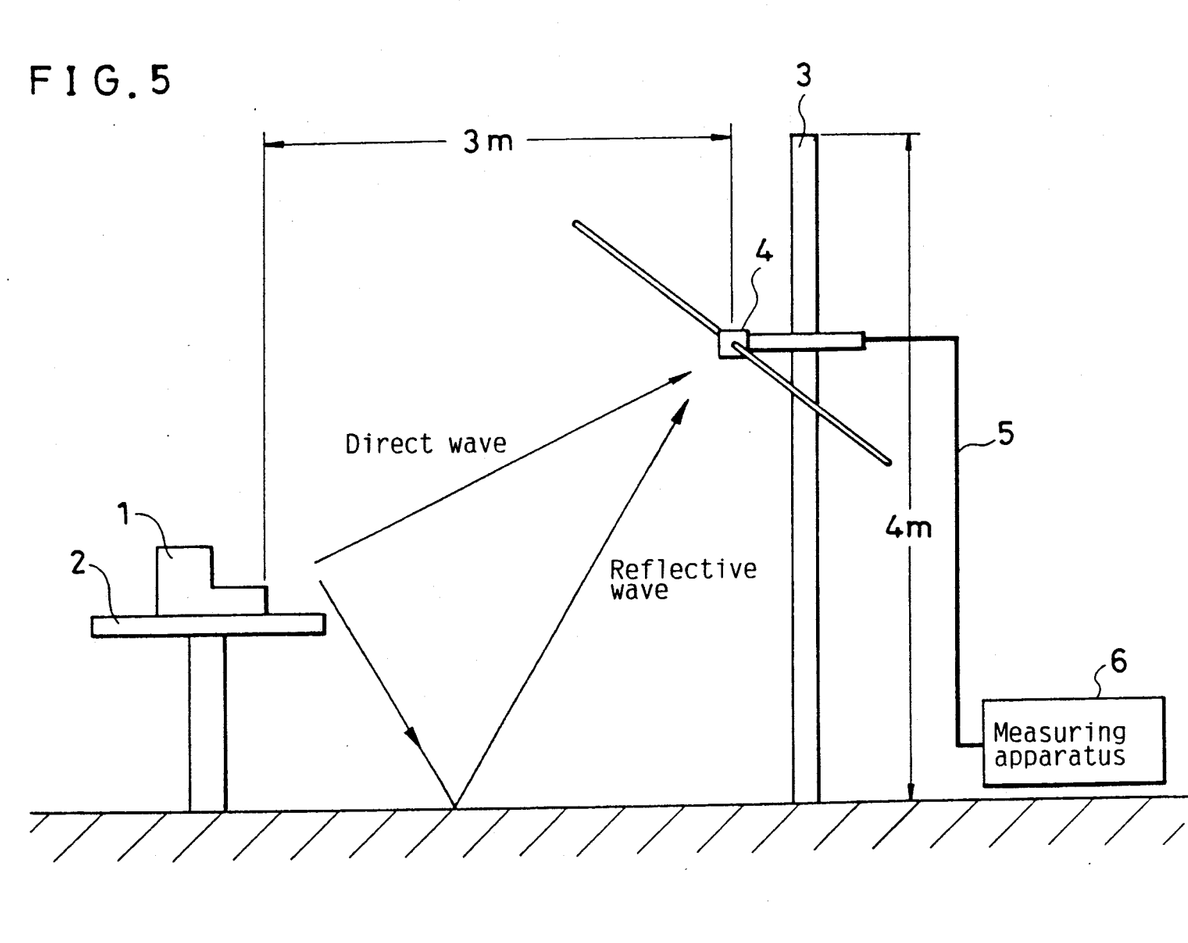
FIG. 5 is the schematic view of the conventional open field test site.

In general, electronic devices have been subject to EMC tests by their manufacture. An arrangement to be used for EMC tests are open-field test site shown in FIG. 5 and electromagnetically anechoic chamber 8 shown in FIGS. 6 and 7. In FIG. 5, the arrangement in the open-field test site comprises a stand 2 to support an apparatus 1 to be tested, a pole 3 for an antenna 4 which is provided at a distant position from the stand 2, in a manner to slide in an up and down direction on the pole 3, and a measuring apparatus 6 which is connected by an electric cable 5 to the antenna 4.

In making noise assessment of radiating electromagnetic waves, the electromagnetic waves radiated from the apparatus 1 to be tested, are measured with the antenna 4 that receives the electromagnetic waves to determine whether the data is below the specified point. When making test irradiation in a strong electric field, a strong electric field is irradiated from the antenna 4 to the apparatus 1 to be tested, and the apparatus 1 to be tested is measured to detect its abnormal state.

Figure 6:
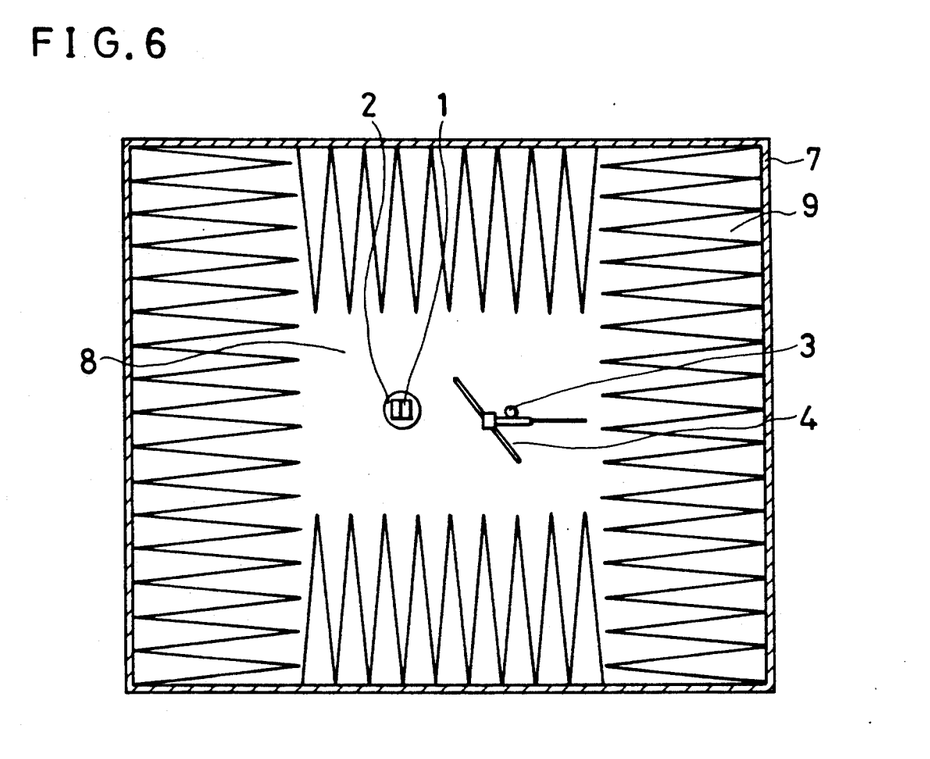
FIG. 6 is the sectional plan view of the electromagnetically anechoic chambers for EMC test.
Figure 7:
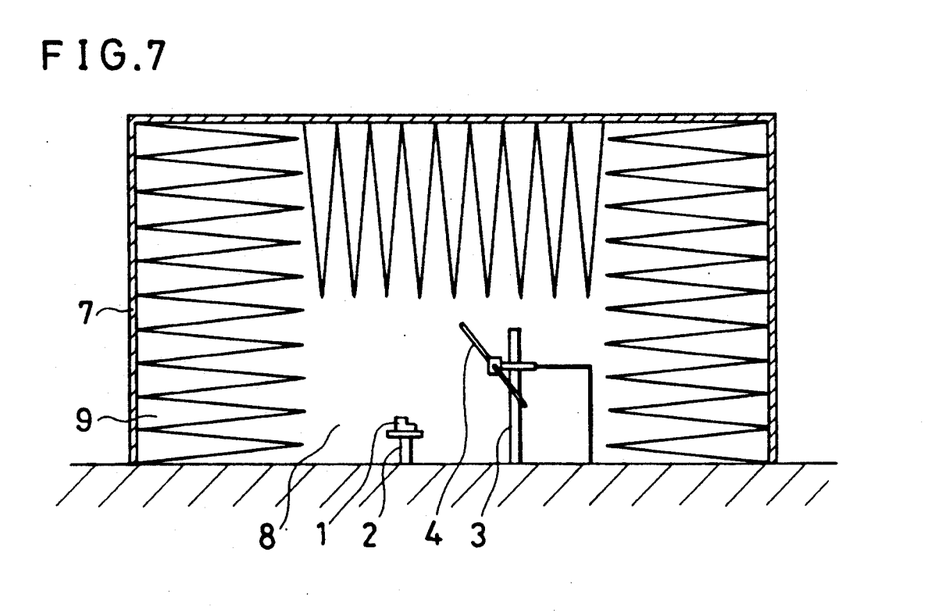
FIG. 7 is the vertical sectional view of the anechoic chamber of FIG. 6.

As shown in FIGS. 6 and 7, a conventional anechoic chamber 8 is surrounded by iron sheets 7 to shield the electromagnetic waves. The inside faces of walls and ceiling of the anechoic chamber 8 are provided with a large number of electromagnetic wave absorbers 9 having a wedge shape. In the anechoic chamber 8 as above-mentioned, an apparatus 1 to be tested, a stand 2 to support the apparatus 1 to be tested, an antenna 4, and a pole 3 for an antenna 4, are provided. EMC tests have been made in the anechoic chamber 8 as above-mentioned by the same way in open-field test site. The absorbers 9 for absorbing electromagnetic waves are made with urethane containing carbon powder of carbon fibers.

Figure 8A:
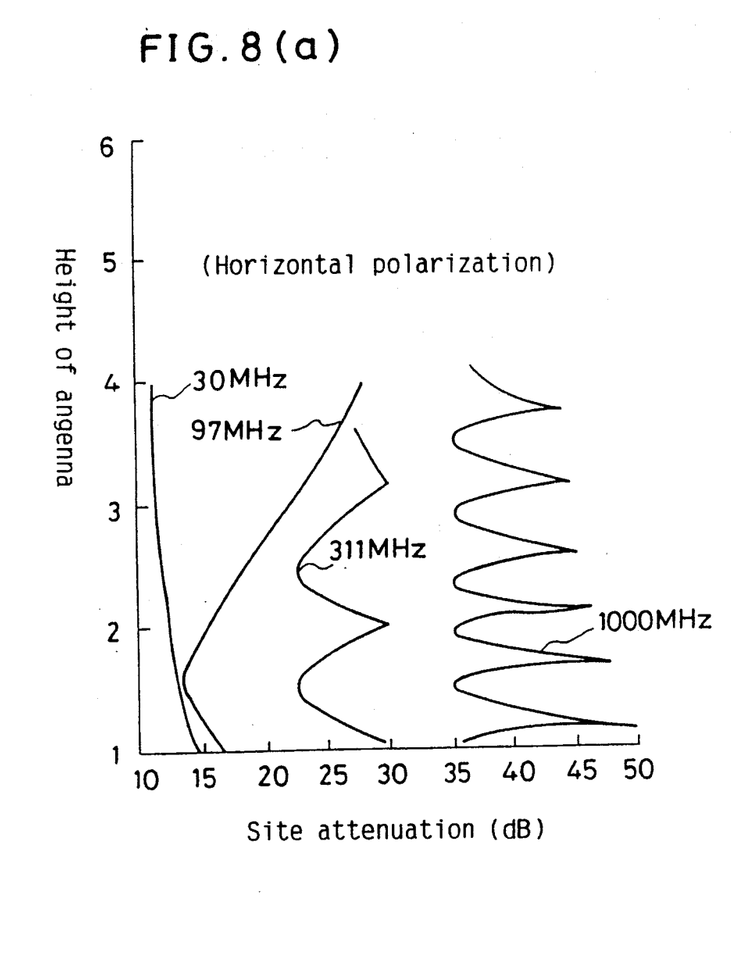
FIG. 8a and FIG. 8b show the characteristic graph showing height-patterns.
Figure 8B:
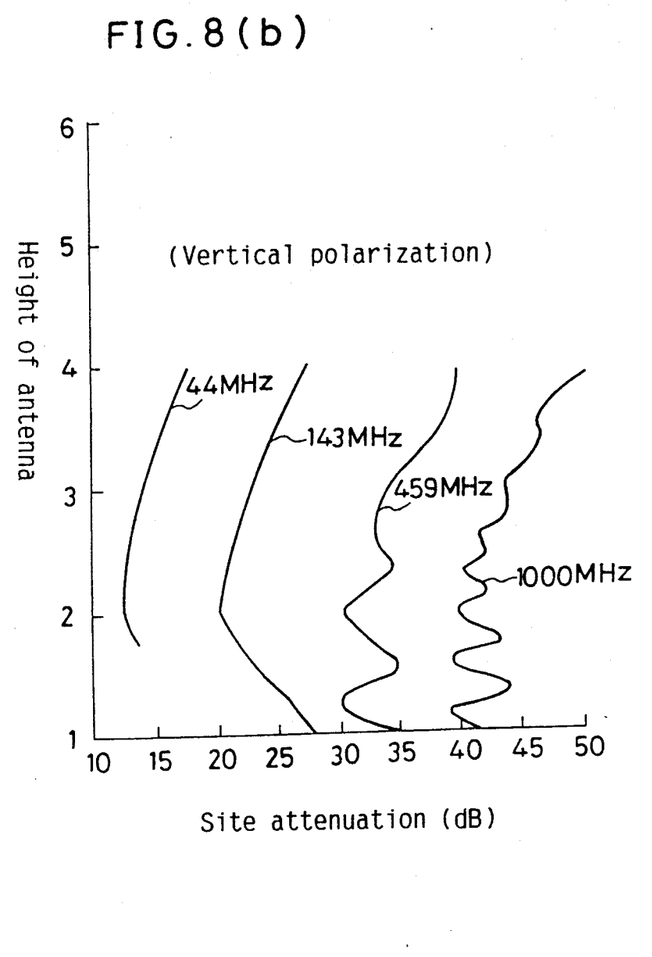

In the EMC tests, the height of the stand 2 is set about 1 meter, because apparatus 1 represents an electronic device which is generally used on a desk in a home. The pole 3 is disposed at 3 meters distance from the stand 2 in compliance with 3 meters rule. The height of the pole 3 is at least 4 meters so that, as shown in FIG. 8, the energies of electromagnetic wave in vertical direction have height-patterns caused by reflection of the waves off the floor of the anechoic chamber 8.

As a general rule, an open-field test site for the EMC tests in FIG. 5 is an open air field, which is a noiseless field. But, since an energy level of noises in electromagnetic waves in a city is high for the EMC tests, the EMC tests in the open air field can not be made in the city. Accordingly, open-field test sites are set up in fields which are remote from cities. Therefore, an operation of the EMC tests in the open-field test site is very inconvenient, and when the weather condition is bad such as rain, snow or strong wind, the EMC tests can not be performed. Also, when an atmospheric temperature or a humidity is changing, the energy level of noise of radiating electromagnetic-wave from the apparatus 1 to be tested is affected. As a result, it is difficult to assure that the EMC tests are operated in the same condition. On the other hand, a chamber or a room as a structure for measurement may be provided. As radiating electromagnetic waves from the apparatus 1 to be tested are reflected by inside surface of the structure to make the background noise, the sensitivity of measurement is lowered by 3 dB or more in comparison with an open-field test site. Particularly, a test of irradiation in strong electric field can not be made since undesirable electromagnetic disturbance to surrounding environment is induced.

On the other hand, an electromagnetically anechoic chamber 8 like that shown in FIGS. 6 and 7 has a shielded structure with the absorbers 9 for electromagnetic wave. Therefore, most of the above-mentioned problems are solved. But the following problems remain. First, the length of an absorber 9 for electromagnetic wave is required to be a length of half of the wavelength of the electromagnetic wave to be absorbed by the absorber 9. In this case, provided that the frequency of the radiative electromagnetic wave is 30 MHz to 1 GHz, the length of the absorber 9 for electromagnetic wave must be over 5 meters long. Also the electromagnetic waves incident to the floor of the anechoic chamber 8 are all reflected by the floor. For this reason, height-patterns of the electromagnetic waves are generated. Accordingly, height of inside of the anechoic chamber 8 is required to be over 5 meters high. From the above-mentioned terms, the anechoic chamber 8 in FIGS. 6 and 7 are each required to be more than 19 meters in length, 16 meters wide, and 10 meters high. Accordingly, the size of the anechoic chamber 8 must be very large, and the cost of the arrangement becomes very expensive. Furthermore, when testing irradiation in a strong electric field, the floor of the anechoic chamber 8 serves as full reflective surface and the electric field is disturbed by the reflected electric field. Therefore, the irradiation test in a strong electric field can not be made in the conventional anechoic chamber 8.

OBJECT AND SUMMARY OF THE INVENTION

Accordingly, it is an object of the present invention to provide a small sized electromagnetically anechoic chamber for making accurate EMC tests therein eliminating the above-mentioned problems.

In order to solve the above-mentioned problems, inside walls of an electromagnetically anechoic chamber are made with panels of electromagnetic wave absorbers comprising ferrite materials to shield electromagnetic waves.

All or part of the panels are arranged to make an angle such that the electromagnetic waves are not reflected to the direction an antenna which is an object of measurement.

The anechoic chamber of the above-mentioned construction of the present invention has a test apparatus to be tested and an antenna in the anechoic chamber. Also, noise assessment of radiating electromagnetic waves and a test of irradiation in a strong electric field are carried out in the anechoic chamber. In the above-mentioned tests, ferrite panels have a wide range of absorbing frequencies, and electromagnetic waves are effectively absorbed by the panels of absorbers thereby enabling the test to be performed with very little reflection.

And, by tilting some of the electromagnetic-wave-absorbing ferrite panels by certain angle with reference to the major part of the panels, a generation of a standing wave of electromagnetic wave is prevented. It is beneficial that the measurements of the tests in the anechoic chamber may be carried out in a high precision by the above-mentioned configuration for prevention of a standing wave. Furthermore, through continuous observation of the measuring apparatus by the measuring engineer through a window having electromagnetic wave shielding net provided at a part of an anechoic chamber, the results of the EMC tests are made and judged at the same time, and thereby a high efficiency of testing and decrease of time for performing the EMC tests are realized. The shield members of the anechoic chamber have double shield members that comprise copper sheets and iron sheets. As a result, it is possible that the range of shielded frequencies increases, shield effect is improved and weight of the anechoic chamber is decreased due to the present invention.

While the novel features of the invention are set forth particularly in the appended claims, the invention, both as to organization and content, will be better understood and appreciated, along with other objects and features thereof, from the following detailed description taken in conjunction with the drawings.

It will be recognized that some or all of the Figures are schematic representations for purposes of illustration and do not necessarily depict the actual relative sizes, numbers or locations of the elements shown.

DESCRIPTION OF THE PREFERRED EMBODIMENT

Referring to the embodiment of the present invention shown in FIG. 1 to FIG. 4, an electromagnetically anechoic chamber 10 has a shield structure 12 at the outside of the walls, floor and ceiling of the anechoic chamber 10. A measuring room 11 is disposed adjacent to the anechoic chamber 10.

Figure 4:
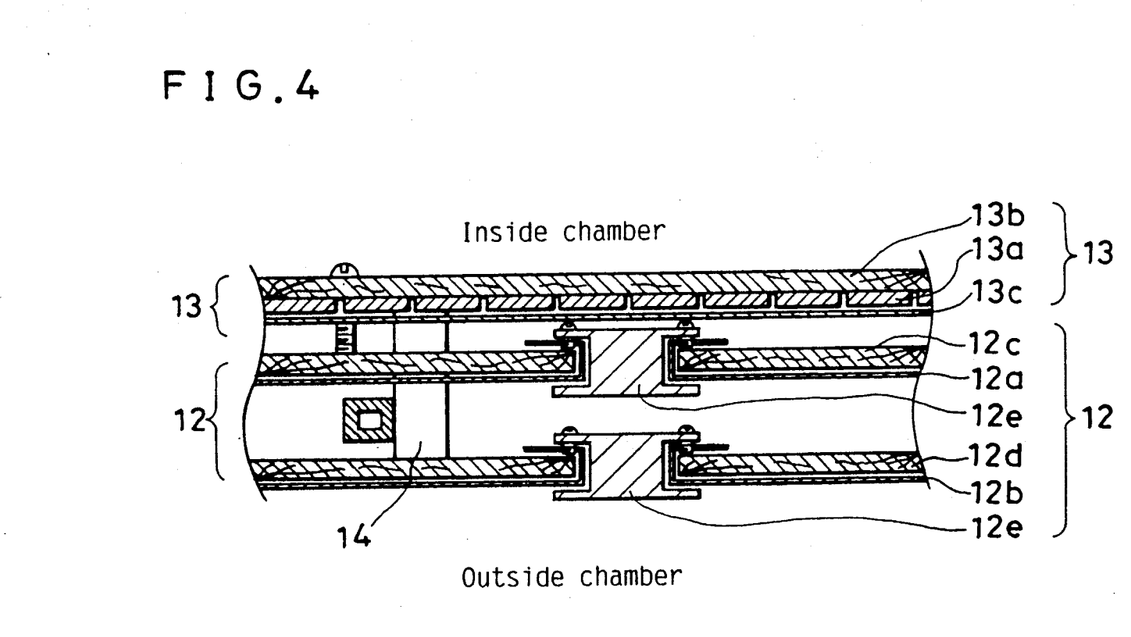
FIG. 4 is a sectional view of a part of a panel of electromagnetic wave absorber and shield members.

The shield member 12 in FIG. 4 has a double shield member which comprises iron sheets 12a and copper sheets 12b. The iron sheets 12a provide great absorption loss against electric field (voltage). Zinc-galvanized sheets of 0.25 millimeter thickness are used as the iron sheets 12a. The copper sheets 12b provides great reflection loss against magnetic field (electric current). Thickness of the copper sheets 12b is 0.28 millimeter. The iron sheets 12a and the copper sheets 12b are put on separate plywood boards 12c, 12d, respectively, and piled up to form a double shield member. A unit consisting of the iron sheet 12a and the copper sheet 12b of the shield member 12 is electrically connected to neighboring unit shield member 12 by connecting metals 12e. The connecting metals 12e are made of aluminum, and have an H-shaped cross section. Each lapel of sheets of iron and copper at the connecting part is over 20 millimeters in width; and as a result, the connecting part is sufficiently shielded by both the iron sheet 12a and copper sheet 12b. The entire inside face of the anechoic chamber 10, namely, inside side walls, a ceiling and a floor comprise panels 13 of electromagnetic wave absorber. The panels 13 each comprise many ferrite tiles 13a, such as those of nickel zinc ferrite bonded on the plywood 13b as shown in FIG. 4. The ferrite tiles 13a are about 10 centimeters by 10 centimeters square and 5 millimeters thick and are bonded on the plywoods 13b, and aluminum foil 13c which is 0.05 millimeter thick is bonded on the ferrite tiles 13a to act as a conductive and reflective sheet. The panels 13 are fixed to the shield members 12 by screws. Plywood 12c and plywood 12d of the shield member 12 and the panels 13 are held by pillars 14.

Figure 1:
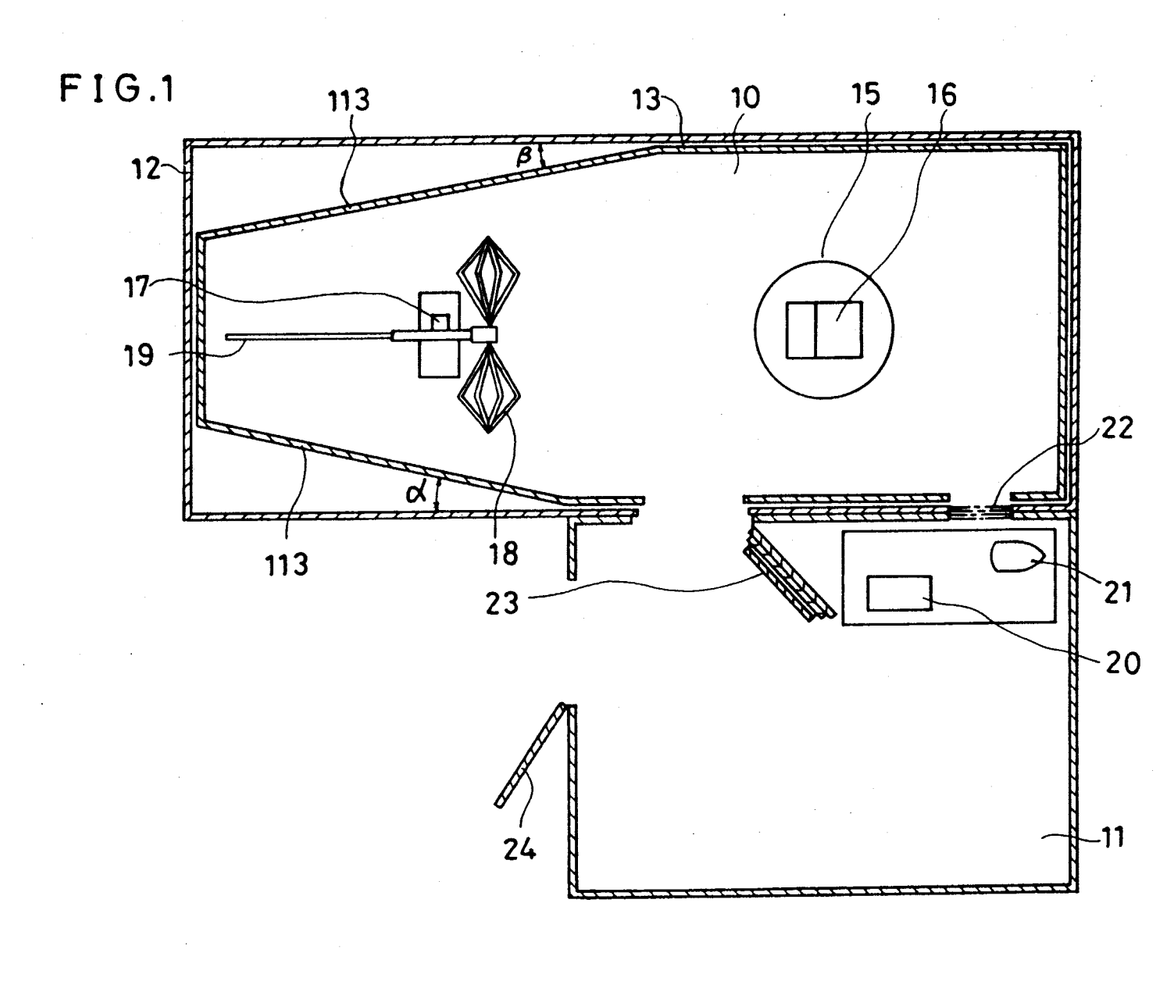
FIG. 1 is a sectional plan view of an electromagnetically anechoic chambers for EMC test embodying the present invention.
Figure 2:
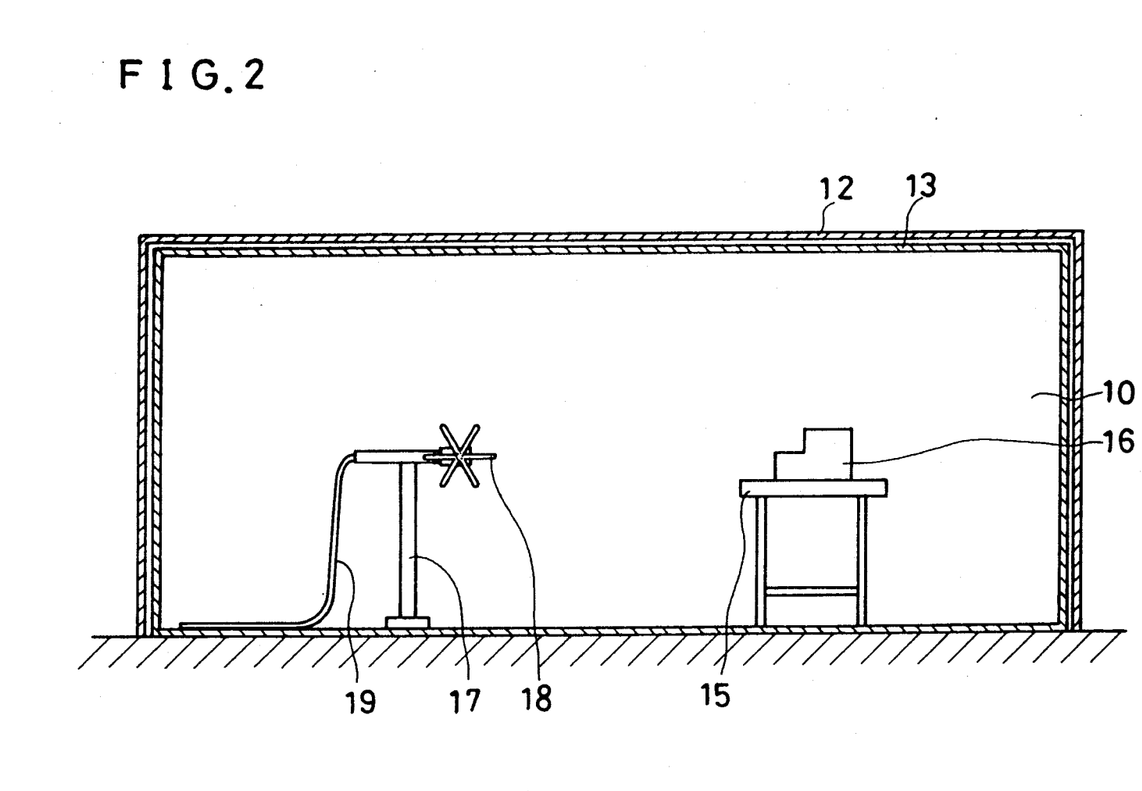
FIG. 2 is a longitudinal sectional view of FIG. 1.
Figure 3:
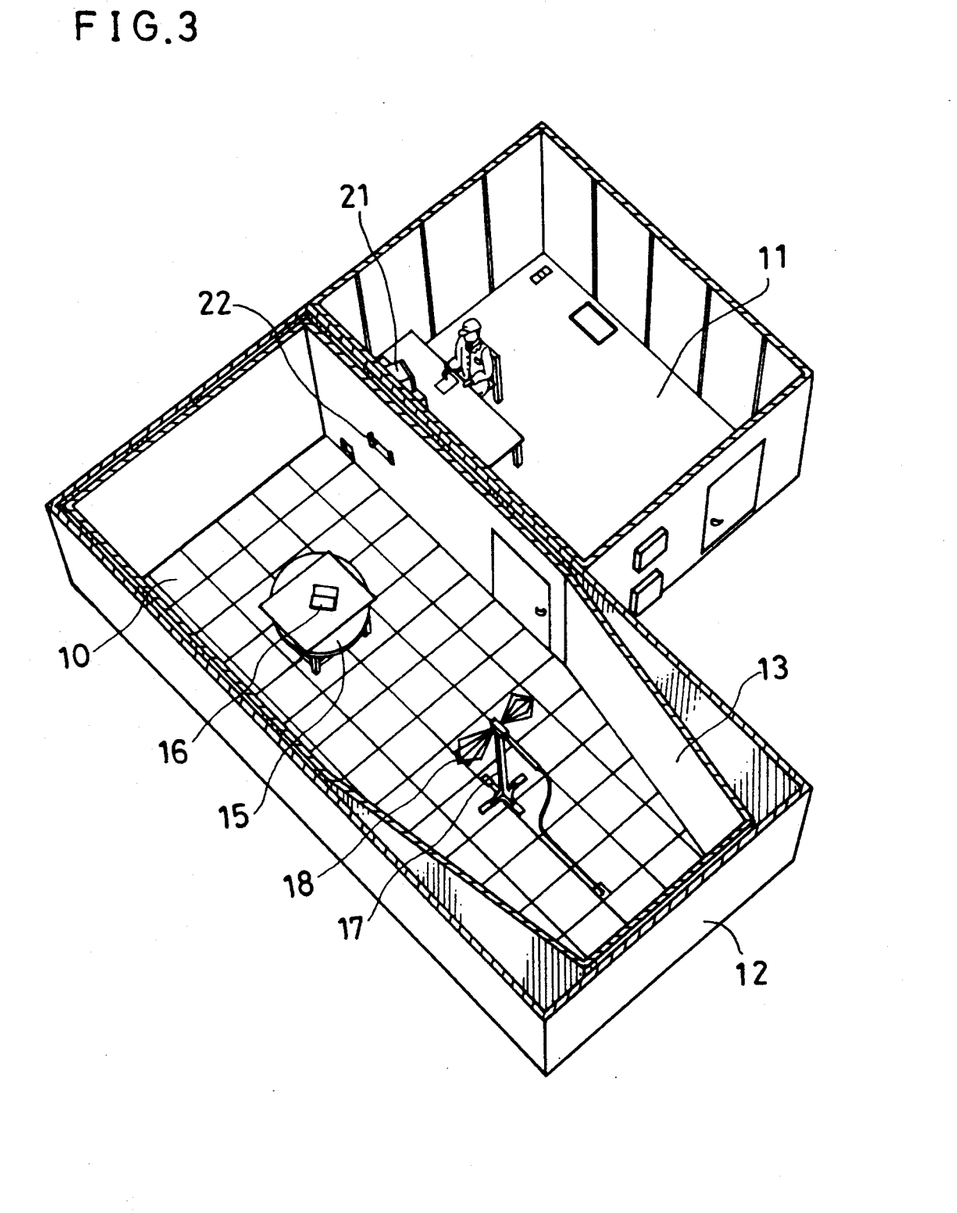
FIG. 3 is a perspective view of the anechoic chamber of FIG. 1 with its ceiling removed.

A table-shaped stand 15 which is about 1 meter high is arranged in the anechoic chamber 10, and the apparatus 16 to be tested is put on the stand 15. A pole 17 for an antenna 18 is set up at a distance of 3 meters from the apparatus 16 to be tested. An antenna 18 is fixed on the pole 17 at a height of about 1 meter from the floor. A cable 19 runs through a hole in the floor and under the floor, and connects the antenna 18 to the measuring apparatus 20 which is in the measuring room 11. A monitor 21 which displays the data obtained by the measuring apparatus 20 is provided in the measuring room 11. An electromagnetically shielded window 22 is arranged on the side wall which separates the anechoic chamber 10 and the measuring room 11. The monitor 21 can be watched through the window 22 by an engineer who works in the anechoic chamber 10. The window 22 comprises double shield glasses containing conductive net. An electromagnetically shielding door 23 is provided on the wall between the anechoic chamber 10 and measuring room 11. Numeral 24 designates a door.

In the anechoic chamber 10, the panels 13 at the sections 113 which are behind the antenna 18 are formed with angles. The angles of the side walls of the parts 113 are α and β with reference to the shield members 12 as shown in FIG. 1. By making such angles of α and β, the reflection wave of radiative electromagnetic wave from the apparatus 16 to be tested is not reflected toward and concentrated to the antenna 18. Therefore, the panels 13 at sections 113 prevent an undesirable standing wave.

Though in the above-mentioned embodiment, the 3 meters rule of the EMC tests is applied by determining, the sizes of the anechoic chamber 10 to comply with the 3 meters rule. Also, the sizes of chamber 10 may be decided in accordance with other rules of the EMC tests. Further, the angles part of the panel may be disposed at other parts of the side walls. Instead of the plywood 12c, 12d, or 13b of the shield member 12 or panel 13, respectively, boards of other material such as synthetic resin can be used.

In the electromagnetically anechoic chamber 10 for the EMC tests of the above-mentioned configuration, the foreign electromagnetic waves are absorbed and reflected by the shield members 12 of double shield member comprising the copper sheets 12b and iron sheets 12a. As a result, the EMC tests in the anechoic chamber 10 are not influenced by the foreign electromagnetic wave.

The anechoic chamber 10 of the present invention is made with the shield members 12 having structure of double shield members of copper sheets 12b and iron sheets 12a. Therefore, electromagnetic waves of various frequencies in a wide range can be shielded, and the shielding effect of the anechoic chamber 10 is improved. For instance, improvement of the shielding effect is above 80 dB at frequencies 150 KHz to 1 GHz. Also, the walls, ceiling and floor of the anechoic chamber 10 are panels and therefore the anechoic chamber 10 is easily assembled and installed. By using ferrite tiles 13a as the absorber for electromagnetic wave, the small-sized absorber can be realized. For example, the absorbers of the present invention is only 5 millimeters in thickness, while the wedge-shaped absorbers in the conventional apparatus are 5 meters in length. Accordingly, the present invention contributes to miniaturization of the anechoic chamber 10. Also, the floor of the anechoic chamber 10 comprises the ferrite tiles 13a in the panel 13. As a result, the characteristics of height patterns are stable and height of the anechoic chamber 10 is made small. Namely, size of the anechoic chamber 10 embodying the present invention is approximately 7 meters in length, 3 meters in width and 2.5 meters in height, while size of the conventional anechoic chamber for 3 meters rule of the EMC test is over 19 meters in length, over 16 meters in width and over 10 meters in height. The anechoic chamber 10 of the present invention is significantly smaller than the conventional anechoic chamber, and cost of installation can be decreased to about 1/10 of the conventional chambers. Of course, the antenna 18 is fixed at a certain fixed height on the pole 19 since the electromagnetic wave is not reflected by the floor of the anechoic chamber 10. Therefore, the test of irradiation in a strong electric field can also be made in the anechoic chamber 10 of the present invention.

During noise assessment of radiative electromagnetic wave, the electromagnetic wave that is radiated from the apparatus 16 to be tested is received by the antenna 18 and is measured by the measuring apparatus 20. The electromagnetic waves which are radiated from the apparatus 16 to be tested in the EMC test to the floor, the ceiling, and the wall are absorbed almost entirely by the panels 13 of absorber having ferrite tiles 13a thereon. Accordingly, the antenna 18 receives substantially the direct waves only from the apparatus 16 to be tested. The electromagnetic wave does not reflect from the floor of the anechoic chamber 10. Therefore, the height-patterns characteristics are stable. Since the antenna 18 need not be moved due to the height of small standing wave in measuring, the antenna 18 can be fixed at a certain height corresponding to the apparatus 16 to be tested. Also, as the panels 13 at the sections 113 are arranged on both side walls at the sides of the antenna 18, substantially no electromagnetic wave is reflected by sections 113 of the panels 13 towards the antenna 18. Accordingly, the generation of the standing wave is prevented, and measuring accuracy of the EMC tests in the anechoic chamber 10 is high. Generally, these measurements are made by the measuring engineer who works in the anechoic chamber 10 to adjust the apparatus 16 to be tested. The measuring engineer can adjust the apparatus by watching the monitor 21 through the window 22. Accordingly, the measurement can be made easily and quickly. There is no need for the measuring engineer commute between the apparatus 16 to be tested or the antenna 18 and the measuring room 11, therefore measuring becomes efficient and the time of measurement can be shortened significantly from that of the conventional case.

When testing irradiation in strong electric field, the test is made by irradiating a strong electric field from the antenna 18 to the apparatus 16 to be tested. Unlike the conventional anechoic chamber, since the floor of the anechoic chamber 10 comprises the panels 13 of electromagnetic wave absorber having ferrite tiles, a strong electric field is not reflected by the floor. Therefore, the test is made without any interference.

As set forth hereinbefore, the electromagnetically anechoic chamber 10 of the present invention is advantageous because it provides precise measurement, shorter measuring time, easy assembly, small size, and low cost of assembly.

Although the invention has been described in its preferred form with a certain degree of particularity, it is understood that the present disclosure of the preferred form has been changed in the details of construction and the combination and arrangement of parts may be referred to without departing from the spirit and the scope of the invention as hereinafter claimed.

What is claimed is:

1. An electromagnetically anechoic chamber for EMC testing comprising:
   double shield panels for defining said chamber, said double shield panels each comprising a first panel and a second panel adjacent to said first panel with a space therebetween, each of said first panel and said second panel having an electromagnetic shield disposed thereon, and
   electromagnetic wave absorber panel means inside of said double shield panels for absorbing electromagnetic waves, said electromagnetic wave absorber panel means comprising:
      a plurality of ferrite tiles arranged as a surface of said electromagnetic wave absorber panel means, and
      aluminum foil covering said ferrite tiles.

2. An electromagnetically anechoic chamber for EMC testing as in claim 1, wherein said electromagnetic wave absorber panel means have sections on opposite sides and at a same end of said chamber which are angled with reference to said double shield panels, said angled sections resulting in an inside of said chamber having width at said same end smaller than said width in a middle portion of said chamber.

3. An electromagnetically anechoic chamber for EMC testing as in claim 1, further comprising:
   a measuring room disposed adjacent to said anechoic chamber said measuring room being shielded from said chamber, and
   an electromagnetically shielded observation window disposed in a wall separating said anechoic chamber and said measuring room.

4. An electromagnetically anechoic chamber for EMC testing as in claim 1, said double shield panels comprising:
   copper sheets secured to a side of said first panel, and
   irons sheets secured to a side of said second panel.

* * * * *